United States Patent
Hung et al.

(10) Patent No.: US 10,650,887 B2
(45) Date of Patent: *May 12, 2020

(54) READING MEMORY CELLS

(71) Applicant: Macronix International Co., Ltd., Hsinchu (TW)

(72) Inventors: Chun Hsiung Hung, Hsinchu (TW); Han Sung Chen, Hsinchu (TW); Ming Chao Lin, TaiChung (TW)

(73) Assignee: Macronix International Co., Ltd., Hsinchu (TW)

( * ) Notice: Subject to any disclaimer, the term of this patent is extended or adjusted under 35 U.S.C. 154(b) by 105 days.

This patent is subject to a terminal disclaimer.

(21) Appl. No.: 15/958,360

(22) Filed: Apr. 20, 2018

(65) Prior Publication Data

US 2018/0240518 A1    Aug. 23, 2018

Related U.S. Application Data

(63) Continuation of application No. 15/063,756, filed on Mar. 8, 2016, now Pat. No. 9,972,383.

(51) Int. Cl.
  *G06F 11/00* (2006.01)
  *G11C 11/56* (2006.01)
  *G06F 11/10* (2006.01)

(52) U.S. Cl.
  CPC ........ *G11C 11/5642* (2013.01); *G06F 11/108* (2013.01); *G06F 11/1048* (2013.01)

(58) Field of Classification Search
  CPC .................................................. G11C 11/5642
  See application file for complete search history.

(56) References Cited

U.S. PATENT DOCUMENTS

| | | | |
|---|---|---|---|
| 6,965,737 B1 * | 11/2005 | Somashekhar | H04B 10/29 398/51 |
| 8,358,542 B2 | 1/2013 | Radke et al. | |
| 9,086,982 B1 * | 7/2015 | Xu | G06F 11/0751 |
| 2004/0109353 A1 * | 6/2004 | Matsuoka | G11C 11/5685 365/185.2 |
| 2014/0258590 A1 | 9/2014 | Kochar | |
| 2015/0293808 A1 * | 10/2015 | Wu | G11C 11/5642 714/704 |
| 2016/0071601 A1 | 3/2016 | Shirakawa et al. | |
| 2017/0186484 A1 * | 6/2017 | Takada | G11C 29/028 |

FOREIGN PATENT DOCUMENTS

CN    103384902    11/2016

* cited by examiner

*Primary Examiner* — Katherine Lin
(74) *Attorney, Agent, or Firm* — Fish & Richardson P.C.

(57) ABSTRACT

A first read operation is performed using a first voltage level to read data from a memory array. An instant bit count corresponding to a number of bits in the data read from the memory array is determined. A recorded bit count corresponding to a number of bits in the data that was written at a time of writing the data to the memory array is accessed. A difference between the instant bit count and the recorded bit count is obtained. Conditioned on determining that the difference is less than or equal to a first threshold value, the data read from the memory array is output using the first read operation. Conditioned on determining that the difference is greater than the first threshold value, a second read operation is performed using a second voltage level that is distinct from the first voltage level.

20 Claims, 8 Drawing Sheets

READING MEMORY CELLS

CROSS-REFERENCE TO RELATED APPLICATIONS

This application is a continuation application of and claims priority to U.S. application Ser. No. 15/063,756, filed on Mar. 8, 2016.

TECHNICAL FIELD

The following disclosure relates generally to reading memory cells.

BACKGROUND

Data that is stored in memory cells in a memory array can be read by applying a voltage to the memory cells, which is referred to as read voltage level or read level. In some memory arrays, the read level can be a fixed voltage level. The threshold voltages of the memory cells can change over time, such that using a fixed read level can lead to inaccuracies in reading data from the memory cells.

SUMMARY

The present disclosure describes devices, systems and techniques for improving the accuracy of read operations performed on memory cells of a memory array. In one implementation, when writing data to memory cells in a memory array (e.g., a flash memory chip), a number of 'high threshold voltage' bits or 'low threshold voltage' bits in the data is computed and stored as a recorded count number (rCN). In some implementations, the high threshold voltage bits correspond to '0' bits and the low threshold voltage bits correspond to '1' bits. However, in other implementations, the high threshold voltage bits correspond to '1' bits and the low threshold voltage bits correspond to '0' bits. When a read command is received, a first read operation is performed to sense the data from the memory cells at a first read level, and the number of high threshold voltage bits or low threshold voltage bits is again computed based on the sensed data to generate an instant counter number (iC/V). The difference between iCN and rCN is obtained. If the difference is greater than a first threshold value, this indicates that the memory data may not be corrected by an error correcting code (ECC). In such cases, one or more additional read operations are performed using different read levels. In one implementation, if the difference is negative, then the read level is increased when performing a second read operation. If the difference is positive, then the read level is decreased when performing the second read operation. Further, optionally in some implementations, if the difference is large, e.g., greater than a second threshold value, indicating that a large number of bits have flipped in the stored data, the new read level is increased (or decreased, as applicable) by a large amount. The second read operation is performed using the updated read level and the process is repeated until (i) the difference is less than the first threshold value, or (ii) a number of read operations exceeds an upper limit on the read operations. The data read from the memory is then outputted. In this manner, in response to a read command, data can be read from memory cells in a memory array by performing additional read operations using different read levels that can be dynamically changed between successive read operations.

In one implementation, after determining the rCN, an ECC value is computed on the rCN bits and the ECC value is stored. When rCN is later read during a read operation, rCN is corrected using the ECC value. If rCN cannot be corrected, then the additional read operations are aborted.

In a general aspect, a first read operation is performed using a first voltage level to read data from a memory array. An instant bit count corresponding to a number of bits in the data read from the memory array is determined. A recorded bit count corresponding to a number of bits in the data that was written at a time of writing the data to the memory array is accessed. A difference between the instant bit count and the recorded bit count is obtained. Conditioned on determining that the difference is less than or equal to a first threshold value, the data read from the memory array is output using the first read operation. Conditioned on determining that the difference is greater than the first threshold value, a second read operation is performed to read the data from the memory array, where the second read operation is performed using a second voltage level that is distinct from the first voltage level.

Particular implementations may include one or more of the following features. Performing the second read operation using the second voltage level based on determining that the difference is greater than the first threshold value may comprise performing the second read operation using a second voltage level that is greater than the first voltage level conditioned on determining that the instant bit count is less than the recorded bit count by a margin that is greater than the first threshold value. The second read operation may be performed using a second voltage level that is less than the first voltage level conditioned on determining that the instant bit count is greater than the recorded bit count by a margin that is greater than the first threshold value.

Performing the second read operation using the second voltage level based on determining that the difference is greater than the first threshold value may comprise performing the second read operation using a second voltage level that is less than the first voltage level conditioned on determining that the instant bit count is less than the recorded bit count by a margin that is greater than the first threshold value. The second read operation may be performed using a second voltage level that is greater than the first voltage level conditioned on determining that the instant bit count is greater than the recorded bit count by a margin that is greater than the first threshold value.

Performing the second read operation using the second voltage level based on determining that the difference is greater than the first threshold value may comprise comparing the difference to a preselected second threshold value based on determining that the difference is greater than the first threshold value. Conditioned on a result of the comparison indicating that the difference is less than the preselected second threshold value, a second voltage level may be selected that deviates from the first voltage level by a first amount. Conditioned on a result of the comparison indicating that the difference is greater than the preselected second threshold value, a second voltage level may be selected that deviates from the first voltage level by a second amount that is greater than the first amount.

Performing the second read operation using the second voltage level based on determining that the difference is greater than the first threshold value may comprise obtaining a number of read operations that have been performed to read the data from the memory array based on determining that the difference is greater than the first threshold value. The second read operation may be performed based on determining that the number of read operations is less than a preselected threshold number of read operations.

Determining the instant bit count may comprise reading the number of bits of data from the memory array. An error correcting code (ECC) value corresponding to the data may be accessed, wherein the ECC value is based on the data at the time of writing the data to the memory array. The instant bit count may be determined by combining the number of bits read from the memory array and the ECC value.

Accessing the recorded bit count may comprise performing an ECC check on the recorded bit count. An ECC value of the recorded bit count may be computed at the time of writing the data to the memory array. The ECC value may be accessed at a time of accessing the recorded bit count. The ECC check may be performed by combining the recorded bit count and the ECC value. A determination may be made whether the recorded bit count can be corrected based on the ECC check. The difference between the instant bit count and the recorded bit count may be obtained in response to determining that the recorded bit count can be corrected based on the ECC check.

In another general aspect, a memory device includes one or more processors, and one or more computer-readable storage media storing instructions that, when executed by the one or more processors, are configured to perform the above-described actions. In particular implementations, the memory device may include a first storage device that is configured to store the recorded bit count and a second storage device that is configured to store an ECC value based on the recorded bit count at the time of writing the data to the memory array. Accessing the recorded bit count to perform the above-described actions may comprise accessing the ECC value from the second storage device at a time of accessing the recorded bit count from the first storage device.

In another general aspect, a memory device includes a first storage unit that is configured to store a recorded bit count corresponding to a number of bits of data that is written to a memory array using a write operation. The memory device includes a second storage unit that is configured to store an instant bit count corresponding to a number of bits in the data that is read from the memory array using a first read operation performed at a first voltage level. The memory device includes a controller that is coupled to the first storage unit and the second storage unit. The controller is configured to access the recorded bit count from the first storage unit and the instant bit count from the second storage unit and obtain a difference between the instant bit count and the recorded bit count. Conditioned on determining that the difference is less than or equal to a first threshold value, the controller is configured to output the data read from the memory array using the first read operation. Conditioned on determining that the difference is greater than the first threshold value, the controller is configured to perform a second read operation to read the data from the memory array. The second read operation is performed using a second voltage level that is distinct from the first voltage level.

Particular implementations may include one or more of the following features. Performing the second read operation using the second voltage level based on determining that the difference is greater than the first threshold value may comprise performing the second read operation using a second voltage level that is greater than the first voltage level conditioned on determining that the instant bit count is less than the recorded bit count by a margin that is greater than the first threshold value. The second read operation may be performed using a second voltage level that is less than the first voltage level conditioned on determining that the instant bit count is greater than the recorded bit count by a margin that is greater than the first threshold value.

Performing the second read operation using the second voltage level based on determining that the difference is greater than the first threshold value may comprise performing the second read operation using a second voltage level that is less than the first voltage level conditioned on determining that the instant bit count is less than the recorded bit count by a margin that is greater than the first threshold value. Conditioned on determining that the instant bit count is greater than the recorded bit count by a margin that is greater than the first threshold value, the second read operation may be performed using a second voltage level that is greater than the first voltage level.

The controller may be further configured to compute the instant bit count. Determining the instant bit count may comprise reading the number of bits of data from the memory array. An error correcting code (ECC) value corresponding to the data may be accessed, where the ECC value is based on the data at a time of writing the data to the memory array. The instant bit count may be determined by combining the number of bits read from the memory array and the ECC value.

Accessing the recorded bit count from the first storage unit may comprise performing an ECC check on the recorded bit count. The controller may be configured to compute an ECC value of the recorded bit count at a time of writing the data to the memory array. At a time of accessing the recorded bit count, the controller may be configured to access the ECC value. The controller may be configured to perform the ECC check by combining the recorded bit count and the ECC value. The controller may be configured to determine whether the recorded bit count can be corrected based on the ECC check. The controller may be configured to obtain the difference between the instant bit count and the recorded bit count in response to determining that the recorded bit count can be corrected based on the ECC check.

At least one of the first storage unit or the second storage unit may be one of a register, a latch, or a memory location. The controller may be one of an on-chip memory controller, an external computer, or a tester device.

Implementations of the above techniques include systems, methods, computer program products and computer-readable media. One such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above described actions.

In this manner, by performing additional read operations using dynamic read levels, data can be reliably read out from the memory cells in the memory array. By performing the additional read operations iteratively, the number of bits in error in the sensed memory data is reduced below the maximum number of bits that can be corrected by ECC. Accordingly, the memory data can be read accurately without requiring enhanced ECC capabilities to deal with a larger number of error bits. In this manner, the devices, systems and techniques described herein can also extend the useful lifetime of the memory cells as retention or other cell degradation occurs.

5

The devices, systems and techniques can be applied to various types of nonvolatile memory arrays, such as NAND flash memory or NOR flash memory, among others, which include ECC correction capabilities for the data stored in the memory cells. Such memory may include single-level cells (SLCs) or multi-level cells (MLCs), e.g., triple-level cells (TLCs) or quadruple-level cells (QLCs), among others.

The details of one or more disclosed implementations are set forth in the accompanying drawings and the description below. Other features, aspects, and advantages will become apparent from the description, the drawings and the claims.

DETAILED DESCRIPTION

Memory cells in a memory array, such as a NAND flash memory chip, can be read, e.g., values of one or more bits stored in the memory cells can be obtained, by applying a voltage to the gate of memory cells at a particular voltage level that is known as the read level for the memory cells. The read level can be a fixed value within a limited range of permissible voltages known as the read window.

Figure 1B:
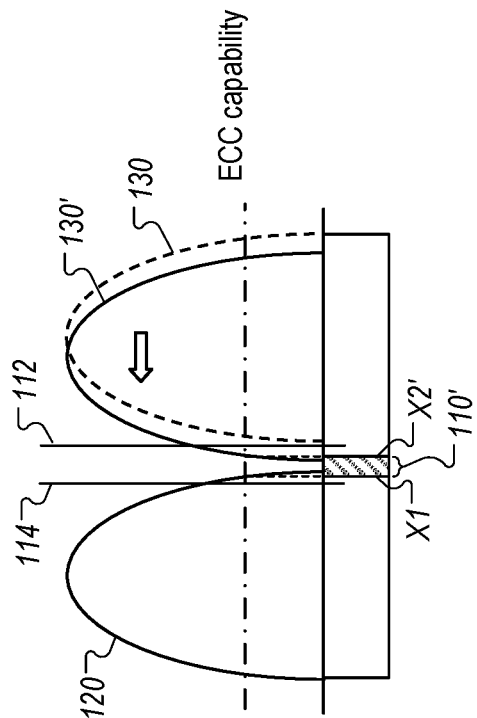
FIGS. 1A and 1B illustrate an example of performing a read operation on memory cells with a fixed read level.
Figure 1A:
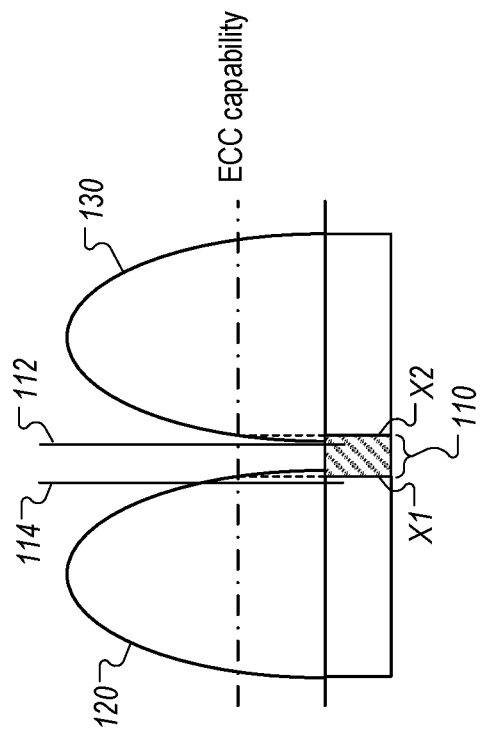

FIGS. 1A and 1B illustrate an example of performing a read operation on memory cells with a fixed read level. As shown in FIG. 1A, the read window for a memory array, such as chunk or page of memory, is denoted by 110, which has a lower limit at voltage level X1 and an upper limit at voltage level X2. Threshold voltage distributions 120, 130 are used for programming the memory cells, e.g., writing data to the memory cells, or for erasing data from the memory cells.

The memory cells in the memory array are ECC-correctable. That is, when reading data from the memory cells, the number of bits in the memory data that have flipped or changed (e.g., changed values from '0' to '1' or vice versa, compared to the values at the time of writing the data) can be corrected if the number does not exceed a maximum number of bits correctable by applying ECC correction. The memory bits may change in value due to various reasons while being stored in the memory cells, e.g., physical conditions such as change in temperature, or due to programming voltages applied to neighboring cells. Additionally or alternatively, the memory bits may change in value due to deficiencies in the memory read operation, e.g., the read level applied may be too low or too high compared to the threshold voltage of the memory cells, resulting in inaccurate readings.

To enable ECC correction, when writing data to the memory cells, an ECC value is computed on the data using a suitable ECC algorithm, and this ECC value is stored, e.g., in a memory location or other suitable hardware such as a register or hard disk. When reading data from the memory array, the stored ECC value is combined with the sensed data (e.g., an XOR operation is performed between the memory data and the ECC value) to correct errors in the bits. The maximum number of bit errors that can be corrected is limited by the ECC algorithm that is used, or by the number of bits used to store the ECC value, or both.

In FIG. 1A, if the read level is within the read window 110, e.g., between voltage levels X1 and X2, then the memory data sensed by performing the corresponding read operation can be corrected by applying ECC correction. For example, if the read level is at 112, which is between voltage levels X1 and X2, then the memory data read is within the ECC capability of the memory array, and the number of error bits in the memory data can be corrected by the ECC operation. However, if the read level is outside the read window 110, e.g., below voltage level X1 or greater than voltage level X2, then the number of errors bits in the memory data is greater than the maximum number of bits that can be corrected by ECC correction. For example, if the read level is at 114, then the memory data cannot be corrected by the ECC operation.

Accordingly, the read level is fixed at a value that is within the read window 110, e.g., at 112. When a read command is issued, e.g., by a processor that is coupled to the memory array, a memory controller sets the read level to the preselected value, e.g., 112, and performs a sensing operation of the memory cells at the fixed read level to obtain the stored data. The memory controller then executes the ECC operation to correct the error bits in the memory data that is read. The read operation is considered successful if the error bits can be corrected by ECC. However, if the error bits cannot be corrected by ECC, then the read operation fails.

In some cases, the threshold voltage distributions for programming or erasing the memory cells can change, e.g., due to data retention, due to data loss with the passage of time, or due to cell degradation from physical wear and tear, among other reasons. In such cases, the read window can shift, e.g., become smaller. For example, FIG. 1B shows that the threshold voltage distribution 130 has changed to 130' due to data retention, and the read window has accordingly changed to 110', with the upper limit of the read window reduced to voltage level X2'. The fixed read level 112 is now greater than X2' and falls outside the read window 110'. Accordingly, when a read operation is performed at the fixed read level 112, the number of bit errors in the memory data is greater than the maximum number of bits that can be corrected by ECC. Therefore, the memory data cannot be read reliably using the fixed read level 112.

The difficulties in reading memory data using a fixed read level may be exacerbated for high density memory, e.g., memory with scale-down process or MLCs, where the read window can be smaller and the fixed read level can go outside the read window more readily due to data retention or other cell degradation, which shifts the read window as noted above. At the same time, such high-density memory cells use higher ECC capabilities to correct a greater number of bit errors that can occur due to process scaling or due to fine-grained variations in the threshold voltage levels for MLCs. However, due to read window shifts, the number of error bits in the memory data can nevertheless exceed the higher ECC capabilities when using a fixed read level.

In some applications, it may be desirable to improve the accuracy of memory read operations, and reduce the occurrence of read failures, e.g., when the error bits in the memory data cannot be corrected by ECC. As described in the following sections, this can be achieved by performing additional read operations in response to a read command, using a read level that is varied dynamically. The read level is adjusted upon detecting a number of bit errors in the memory data that is greater than the ECC correction capability for the memory array. Additional read operations are performed with the read level set to a value that leads to a lower number of bit errors in the data read from memory, where the lower number of bit errors can be corrected by ECC. In this manner, requirement of higher ECC capability can be reduced and effects of data retention or other cell degradation can be mitigated.

The following sections disclose memory arrays, and associated devices, systems and techniques, in which multiple read operations are performed using dynamic read levels. In one implementation, the devices, systems and techniques described in the following sections are applied to nonvolatile memory arrays, e.g., flash memory chips, which include ECC capabilities. However, in other implementations, the devices, systems and techniques described in the following sections can also be applied to other types of memory.

Figure 2B:
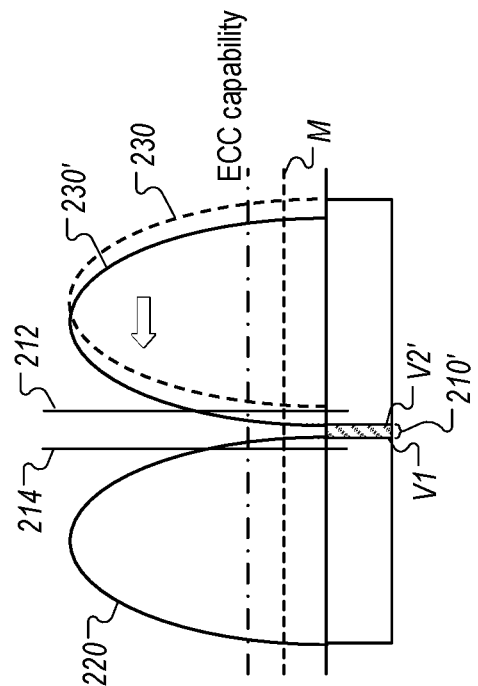
FIGS. 2A and 2B illustrate an example of performing read operations on memory cells using dynamic read levels, according to one implementation.
Figure 2A:
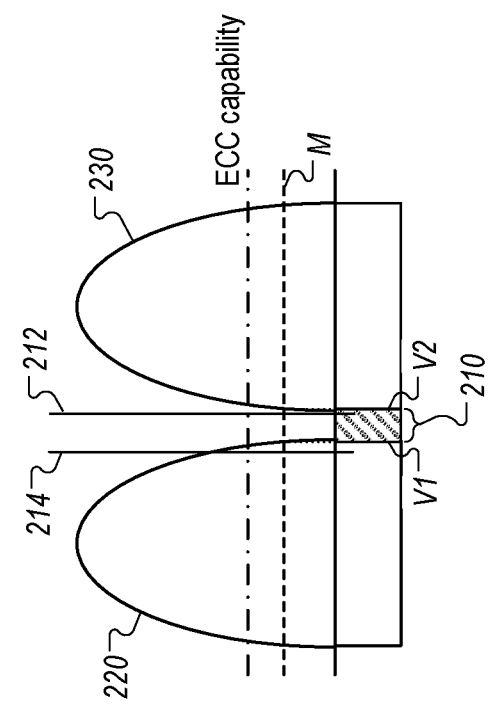

FIGS. 2A and 2B illustrate an example of performing read operations on memory cells using dynamic read levels, according to one implementation. As shown in FIG. 2A, the read window for a memory array, such as chunk or page of memory cells, is denoted by 210, which has a lower limit at voltage level V1 and an upper limit at voltage level V2. 220 and 230 indicate threshold voltage distributions for programming the memory cells, and/or erasing data from the memory cells.

The memory cells in the memory array are ECC-correctable. A read level that is within the read window 210, e.g., between voltage levels V1 and V2, is within the ECC correction capability of the memory array. For example, if a read operation is performed at read level 212, then the number of error bits in the memory data do not exceed the maximum number of bits that can be corrected by applying ECC correction, and accordingly the data can be corrected by the ECC operation.

However, if the read level is outside the read window 210, e.g., below voltage level V1 or greater than voltage level V2, then the number of error bits in the memory data sensed by the read operation is greater than the maximum number of bits that can be corrected by ECC correction. For example, if the read level is at 214, then the memory data cannot be corrected by the ECC operation.

To determine whether the read level is within the range of voltages that satisfy the ECC correction capability of the memory array, the read operations in FIGS. 2A and 2B perform an additional check. A dynamic read level threshold, M, is used for the memory array. In one implementation, M is an integer that corresponds to a number of bits that is less than the maximum number of bits that can be corrected by ECC (the ECC capability), as shown in FIGS. 2A and 2B. In another implementation, M can correspond to the same number of bits as the ECC capability of the memory array. In one implementation, M is a system parameter that is set for the device 400. In another implementation, M is a configurable parameter, e.g., a user of the device 400 can set the value of M prior to using the device.

As described in greater detail below, when a read operation is performed in response to a read command, a bit count difference, $\Delta BC$, is computed, which corresponds to a number of bits of the memory data that have changed values as determined by the read operation, compared to the memory data at the time of writing to the memory array. $\Delta BC$ is compared to M If the absolute difference, $|\Delta BC|$, is less than or equal to M (i.e., $|\Delta BC| \leq M$), then the number of bits that have changed values are determined to be within the ECC capability of the memory array and the bit errors observed in the read operation can be corrected by ECC. For example, if a read operation is performed using read level 212, then $|\Delta BC| \leq M$ and the memory data is ECC correctable. In such cases, additional memory read operations are not needed.

On the other hand, if $|\Delta BC|$ is greater than M (i.e., $|\Delta BC| \geq M$), then the number of bits that have changed values may be outside the ECC capability of the memory array, such that a determination cannot be made with certainty that the bit errors observed in the read operation can be corrected by ECC. For example, if a read operation is performed using read level 214, then $|\Delta BC| > M$ and the memory data may not be ECC correctable. In such cases, one or more additional read operations are performed using different read levels. For example, 214 is below the lower limit V1 of the read window 210. A second read operation may be performed using a higher read level, e.g., using a read level that is greater than V1 and within the read window 210.

Due to data retention or cell degradation, among other reasons, the threshold voltage distributions for programming or erasing the memory cells can change with time. In such cases, the read window can shift, e.g., become smaller. For example, FIG. 2B shows that the threshold voltage distribution 230 has changed to 230', and the read window has accordingly changed to 210', with the upper limit of the read window reduced to voltage level V2'. The read level 212 is greater than V2' and falls outside the read window 210'. Accordingly, if a read operation is now performed at read level 212, the number of errors in the memory data is not ECC correctable.

In such cases, additional read operations are performed using dynamic read levels. For example, a new read level is selected that satisfies the criterion $|\Delta BC| \leq M$ and a new read operation is performed at this read level. The memory data read using the new read level will be ECC correctable. In this manner, by adjusting the read level dynamically such that it satisfies the threshold M, the number of error bits in the read operation can be guaranteed to be ECC correctable.

As noted above, in one implementation, M corresponds to a number of bits that is less than the ECC capability of the memory array. In such situations, a read level that satisfies the criterion $|\Delta BC| \leq M$ can yield bit errors that are less than the maximum number of bits that can be corrected by ECC. Accordingly, by setting M to be lower than the maximum number of ECC-correctable bits, higher ECC capability of the memory array may not be needed. In one implementation, M is selected from a range that is between half of a maximum number of ECC-correctable bits and the maximum number of ECC-correctable bits. That is, $0.5*ECC$ capability $\leq M \leq ECC$ capability. If M is less than $0.5*ECC$ capability, then an extra read operation that is executed by setting another read level may be needed, which may decrease the performance of the read operation.

The example illustrated above with respect to FIG. 2B describes a situation where the initial read level is greater than read levels that correspond to the threshold M, such that the read level is adjusted to move down in a subsequent read operation. In some situations, the initial read level can be less than read levels that correspond to the threshold M In such cases, the read level is adjusted to move up in a subsequent read operation. In one implementation, a determination whether the read level is to be dynamically moved up or moved down is made by determining whether the number of bits in the data read from the memory array is greater than or less than a number of bits in the data that was recorded when the data was written to the memory array.

Figure 3:
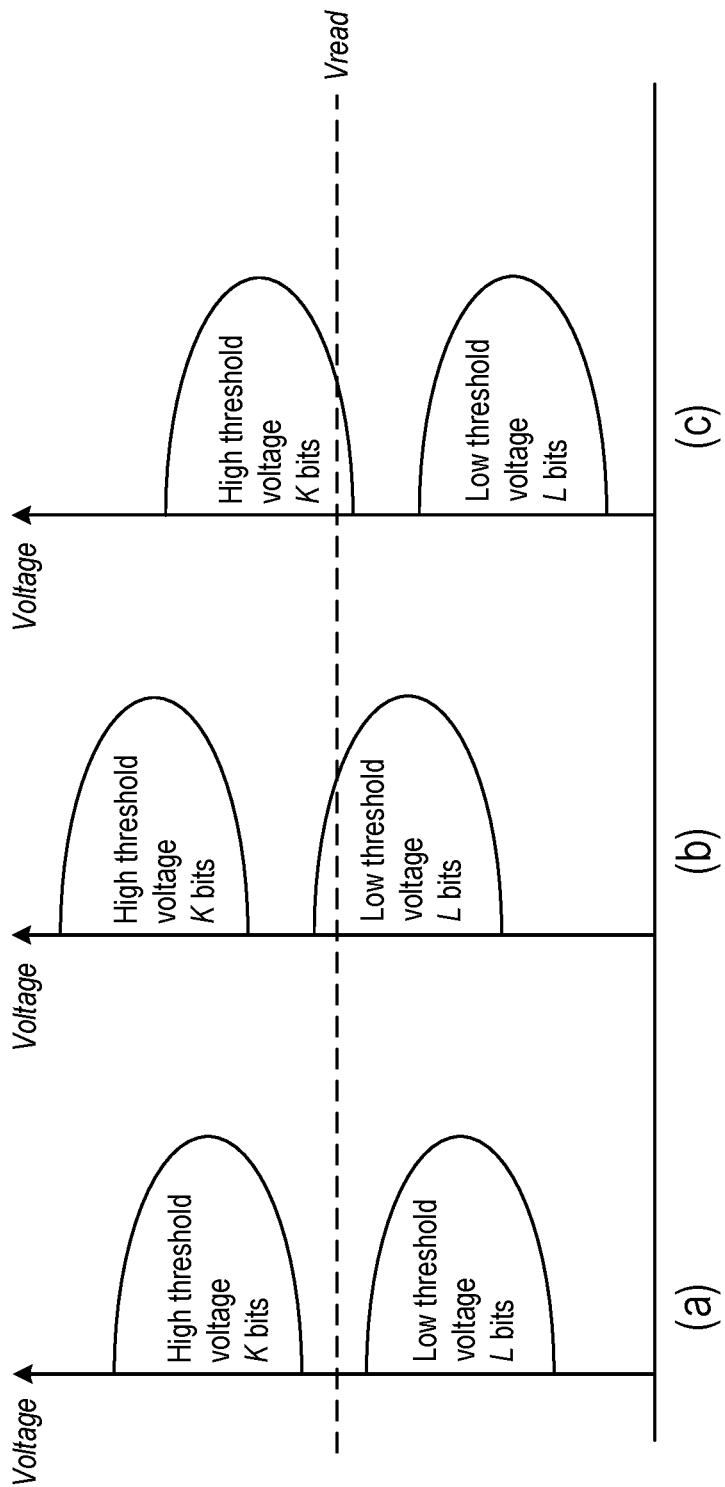
FIG. 3 illustrates an example of determining a dynamic read level, according to one implementation.

FIG. 3 illustrates an example of determining a dynamic read level, according to one implementation. When the data is written to a memory array (e.g., a page or chunk of a memory array), a number of 'high threshold voltage' bits (e.g., '0' bits in one implementation) or a number of 'low threshold voltage' bits (e.g., '1' bits in one implementation) in the data is counted, and this number is stored as a recorded counter number (rCN). For example, FIG. 3 shows memory data that includes K high threshold voltage bits and L low threshold voltage bits when the data is written to memory cells in a memory array (K and L are integers ≥0). An initial read is performed in FIG. 3 using a read level Vread.

In one implementation, the L number of low threshold voltage bits is counted and this number is stored as rCN, e.g., in suitable storage such as a memory location, a register, or a hard disk, among others. When a memory read operation is performed, the number of low threshold voltage bits in the data, as read from the memory array, is counted again and set to an instant counter number (iCN). rCN is accessed from storage and the difference between iCN and rCN is computed as the bit count difference ΔBC, which is then compared to the threshold M. As noted previously, if |ΔBC|≤M, then the number of bits that have flipped (e.g., changed from '1' to '0' or vice versa) in the data that is sensed by the read operation is within the maximum number of bits that can be corrected by ECC, and no further read operation is needed. This may be the case, for example, when the read level Vread is within the read window, as shown by case (a) in FIG. 3A. However, if |ΔBC|>M, then the number of bits that have flipped exceeds the ECC correction capability for the memory array, and one or more additional read operations are performed using different read levels.

To determine if the read level for the next read operation is to be increased or decreased compared to the last read level, the polarity of ΔBC is checked. If a number of bits less than L is read to be low threshold voltage bits, then iCN is less than rCN and the polarity of ΔBC is negative. This may be the case when the high and low threshold voltage distributions have changed, e.g., due to data retention, data loss or cell degradation as described above, such that the read window has shifted to a higher voltage range compared to the read window in case (a) of FIG. 3. Accordingly, the read level Vread that was within the read window in case (a) is now less than a lower voltage limit corresponding to the updated read window, as shown by case (b) of FIG. 3. In such a case, a new read level is selected within the updated read window, where the new read level is at a higher voltage compared to Vread, and a new read operation is performed at the higher read level.

On the other hand, if a number of bits greater than L is observed as low threshold voltage bits when the data is read from the memory array, then iCN is greater than rCN and the polarity of ΔBC is positive. This may indicate that the read level used in the previous read operation had caused a greater number of bits to be read incorrectly as low threshold voltage bits ('1'). This may be the case, for example, when the high and low threshold voltage distributions have changed, e.g., due to data retention, data loss or cell degradation as described above, such that the read window has shifted to a lower voltage range compared to the read window in case (a) of FIG. 3. Accordingly, the read level Vread that was used in case (a) is now greater than an upper voltage limit corresponding to the updated read window, as shown by case (c) of FIG. 3. In such a case, a read level is selected within the changed read window, where the new read level is at a lower voltage level than Vread, and a new read operation is performed at the lower read level.

As an illustrative example, consider data written to a memory array that includes 300 high threshold voltage bits and 500 low threshold voltage bits (i.e., K=300 and L=500). The memory array uses ECC correction with up to 12 bits of correction capability. The dynamic read level threshold M is set to 8. When the data is written to the memory array, rCN is computed based on the 500 low threshold voltage bits and stored, i.e., rCN=500.

When a read operation is performed, the number of low threshold voltage bits in the sensed data is determined to be 500, such that iCN=500. In this case, |ΔBC|=|iCN−rCN|=0<(M=8). Accordingly, the data sensed by the read operation can be corrected by ECC and additional read operations using different read levels are not needed. This situation corresponds to case (a) of FIG. 3.

When a read operation is performed, the number of low threshold voltage bits in the sensed data is determined to be 484, such that iCN=484. In this case, |ΔBC|=|iCN−rCN|=16>(M=8). Accordingly, the sensed memory data cannot be corrected by ECC and additional read operations are needed. Since ΔBC=iCN−rCN=−16, the polarity of ΔBC is negative and the read level is moved up. For example, the read level for the next read operation is selected to be greater than the last read level. This situation corresponds to case (b) of FIG. 3.

When a read operation is performed, the number of low threshold voltage bits in the sensed data is determined to be 514, such that iCN=514. In this case, |ΔBC|=|iCN−rCN|=14>(M=8). Accordingly, the sensed data cannot be corrected by ECC and additional read operations are needed. Since ΔBC=iCN−rCN=14, the polarity of ΔBC is positive and the read level is moved down. For example, the read level for the next read operation is selected to be less than the last read level. This situation corresponds to case (c) of FIG. 3.

The preceding section describes determination of dynamic read levels based on counting the number of low threshold voltage bits. However, in another implementation, the dynamic read levels are determined by counting the number of high threshold voltage bits. In such an implementation, rCN and iCN are based on the number of high threshold voltage bits in the memory data computed at the time of writing to the memory cells, and when reading the data from the memory cells, respectively.

In the implementation described above (e.g., counting low threshold voltage bits), the read level is moved up when the polarity of ΔBC is negative, and the read level is moved down when the polarity of ΔBC is positive. Alternative implementations are also possible, e.g., by counting high threshold voltage bits. For example, in one implementation, the read level is moved down or decreased when the polarity of ΔBC is negative (e.g., iCN is less rCN), and the read level is moved up or increased when the polarity of ΔBC is positive (e.g., iCN is greater than rCN).

In the above manner, read levels for additional read operations can be dynamically determined based on counting the number of low threshold voltage or high threshold voltage bits in the memory data. Additionally, in some implementations, when adjusting the read level for an additional read operation, the amount of change in voltage for the new read level, compared to the read level used in the previous read operation, is determined based on how large the difference is between iCN and rCN. For example, in one implementation, in addition to the dynamic read level threshold M, a move step threshold N is also set. The bit count difference between iCN and rCN, $\Delta BC$, is also compared to N to determine whether the new read level is to be set to a large value (a large move step) or a small value (a small move step) compared to the last read level.

In one implementation, N is a system parameter that is set for the device 400 and is configured to represent a number of bits that indicates a large divergence between iCN and rCN. In one implementation, N is a configurable parameter, e.g., a user of the device 400 can set the value of N prior to using the device. In one implementation, N is a non-negative integer and N>M.

If $|\Delta BC| \geq N$ then the new read level corresponds to a large move step. However, if $|\Delta BC| < N$, then the new read level corresponds to a small move step. In one implementation, a large move step corresponds to a voltage difference of approximately 100 milli-volts (mV) between the new read level and the previous read level, while a small move step corresponds to a voltage difference of approximately 50 mV between the new read level and the previous read level. However, other suitable values of the voltage differences are also possible. The large move step is designed to reduce the number of additional read operations that are performed, which may lead to faster read times and thereby improve memory read performance. The small move step is designed to enhance resolution as the dynamic read level approaches an optimal read level, e.g., within the read window.

As an illustrative example, consider a situation similar to that discussed previously, e.g., data written to a memory array that includes 300 high threshold bits and 500 low threshold bits (i.e., K=300 and L=500). The memory array uses ECC correction with up to 12 bits of correction capability. The dynamic read level threshold M is set to 8 and the move step threshold N is set to 24. When the data is written to the memory array, rCN is computed based on the low threshold bits and stored, i.e., rCN=500.

When a read operation is performed at read level Vread that is within the read window as shown in case (a) of FIG. 3, the number of low threshold bits in the sensed data is determined to be 500, such that iCN=500. In this case, $|\Delta BC|=|iCN-rCN|=0<(M=8)$. Accordingly, the read memory data can be corrected by ECC and additional read operations using different read levels are not needed.

When the read window changes to a higher voltage range, e.g., as shown by case (b) of FIG. 3, but a read operation is performed at read level Vread, which is less the lower limit of the updated read window, the number of low threshold bits in the sensed data is determined to be 484, such that iCN=484. In this case, $|\Delta BC|=|iCN-rCN|=16>(M=8)$. Accordingly, the read memory data cannot be corrected by ECC and additional read operations are needed. Since the polarity of $\Delta BC$ (iCN−rCN=−16) is negative, the read level is moved up. Further, $|\Delta BC|=16<(N=24)$ and thereby a small move step is used. Accordingly, the new read level is increased compared to the last read level by a small move step, e.g., 50 mV.

When the read window changes to a lower voltage range, e.g., as shown by case (c) of FIG. 3, but a read operation is performed at read level Vread, which is higher than the upper limit of the updated read window, the number of low threshold bits in the sensed data is determined to be 528, such that iCN=528. In this case, $|\Delta BC|=|iCN-rCN|=28>(M=8)$. Accordingly, the read memory data cannot be corrected by ECC and additional read operations are needed. Since the polarity of $\Delta BC$ (iCN−rCN=28) is positive, the read level is moved down. Further, $|\Delta BC|=28>(N=24)$ and thereby a large move step is used. Accordingly, the new read level is decreased compared to the last read level by a large move step, e.g., 100 mV.

Figure 4A:
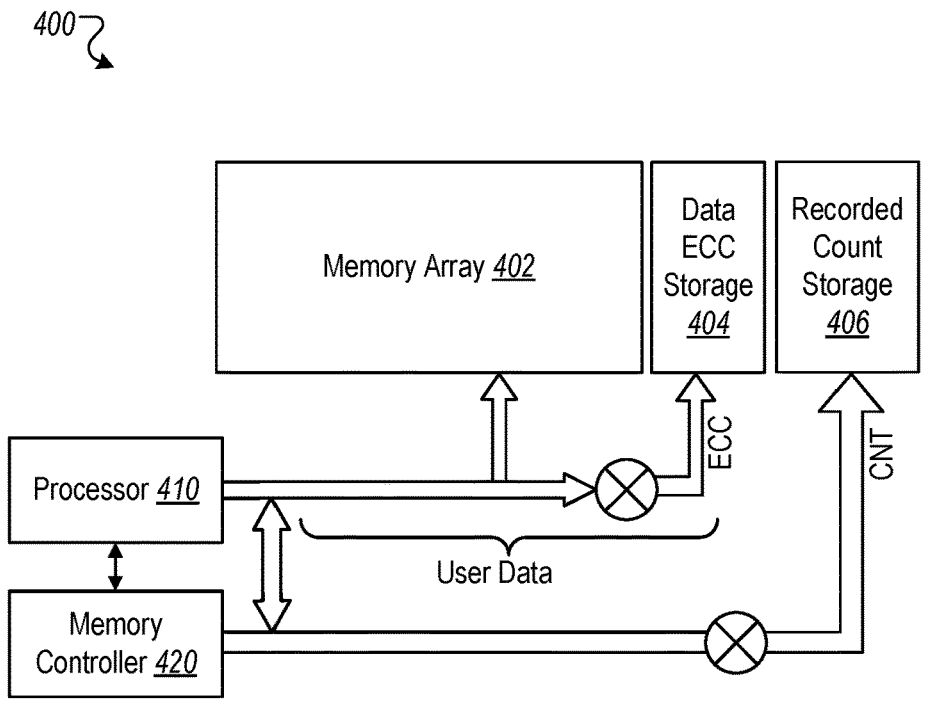
FIGS. 4A and 4B illustrate examples of a device for performing read operations on memory cells using dynamic read levels, according to one implementation.
Figure 4B:
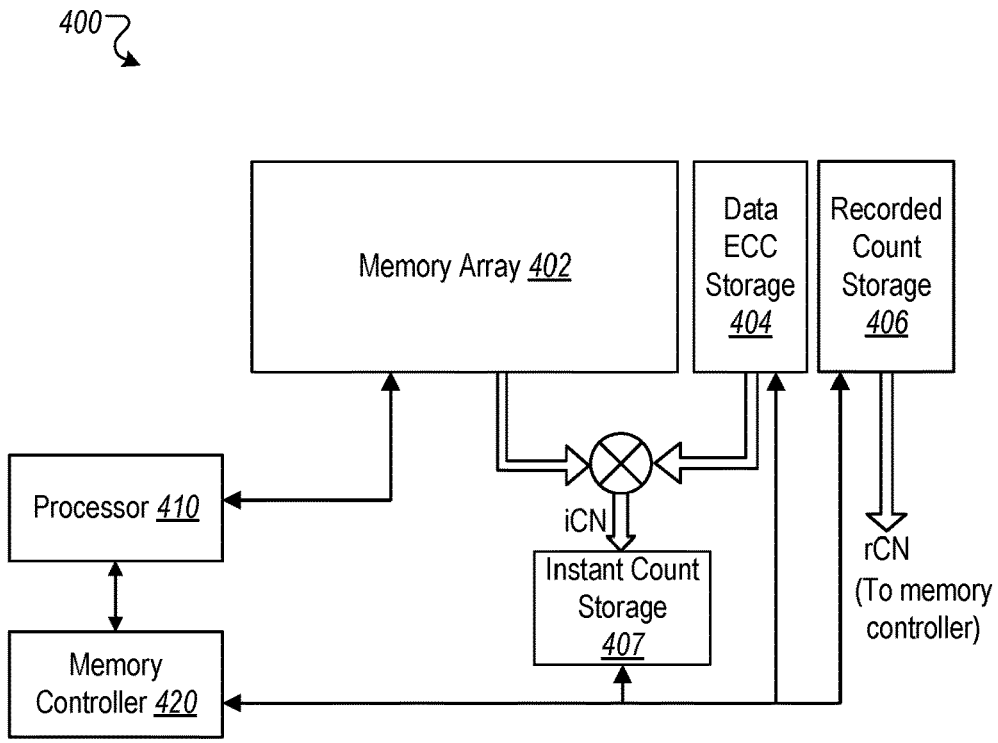

FIGS. 4A and 4B illustrate examples of a device 400 for performing read operations on memory cells using dynamic read levels, according to one implementation. The device 400 includes a memory array 402, a data ECC storage 404, a recorded count storage 406, an instant count storage 407, a processor 410 and a memory controller 420.

The memory array 402 is a suitable memory unit that is configured for storing user data. For example, the memory array 402 can be a chunk or page of memory, which includes a plurality of memory cells. The memory cells can be single-level cells or multi-level cells. In one implementation, the memory array 402 is a nonvolatile memory unit, e.g., flash memory. However, in other implementations the memory array can be some other type of memory.

The data ECC storage 404 is a suitable storage unit that is configured for storing ECC data. For example, the data ECC storage 404 can be a separate portion of a memory device that includes the memory array 402. Alternatively, the data ECC storage 404 can be a separate memory unit, a register, or other hardware storage device, such as a hard disk.

The recorded count storage 406 is a suitable storage unit that is configured for storing recorded counter number (rCN) data. For example, the recorded count storage 406 can be a separate portion of a memory device that includes the memory array 402 and/or the data ECC storage 404. Alternatively, the recorded count storage 406 can be a separate memory unit, a register, a latch, or other hardware storage device, such as a hard disk.

The instant count storage 407 is a suitable storage unit that is configured for storing instant counter number (iCN) data. For example, the instant count storage 407 can be a separate portion of a memory device that includes the memory array 402 and/or the data ECC storage 404. Alternatively, the instant count storage 407 can be a separate memory unit, a register, a latch, or other hardware storage device, such as a hard disk.

The processor 410 is a suitable computing unit that is configured to execute various instructions for the operation of the device 400, including instructions for exchanging user data between the memory array 402 and other modules of the device 400, or with external devices. The processor 410 can be a general purpose microprocessor, a microcontroller, or other suitable processing unit. In one implementation, the processor 410 controls the memory controller 420 for writing data to or reading data from the memory array 402.

The memory controller 420 includes hardware and software logic for performing various operations associated with memory coupled to the device 400, including the data array. In one implementation, the memory controller 420 programs the memory array 402, reads data from the memory array 402, or erases data stored in the memory array 402, among other uses. The memory controller 502 can include a microprocessor that executes instructions for programming, reading or erasing the memory array 402. In one implementation, the memory controller 420 performs operations associated with the memory array 402 upon receiving commands from the processor 410.

In one implementation, the memory array 402 and the memory controller 420 are implemented on the same integrated circuit chip. The data ECC storage 404 and the recorded count storage 406 also can be implemented on the same chip, for example, when the data ECC storage 404 and the recorded count storage 406 are portions of the same memory device as the memory array 402. However, in other implementations, the memory controller 420 is implemented as a physically distinct unit separate from the memory array 402. This can be the case, for example, when the memory controller 420 is an external computer, or an external tester device, among other suitable implementations.

The instructions executed by the processor 410 and/or the memory controller 420 are stored in suitable storage accessible to the processor 410 and/or the memory controller, e.g., a flash memory module or hard disk, among others. For example, the instructions can be stored in other portions of the memory device that includes the memory array 402.

FIG. 4A shows an example of an operation performed by the device 400 for writing data to memory. User data is programmed to the memory array 402. An ECC value is computed on the user data and the ECC value is programmed to the data ECC storage 404. The ECC value can be computed at the time of writing the user data to the memory array 402, or the ECC value can be computed separately at a different time, e.g., after the user data is written to the memory array 402. The ECC value is computed by the processor 410, or the memory controller 420, as applicable, by applying a suitable ECC algorithm. Examples of ECC algorithms used include Hamming Algorithm, Reed-Solomon Algorithm, and Bose-Chaudhuri-Hocquenghem (BCH) algorithm, among others.

In addition to computing the ECC value on the user data, rCN is computed based on the bits in the user data and the ECC value. rCN can be computed when the user data and the ECC value are programmed, or rCN can be computed at a different time after the user data and the ECC value are written to the memory array 402 and the data ECC storage 404 respectively. In one implementation, rCN is computed by counting the aggregate number of low threshold bits in the user data and the ECC value. In another implementation, rCN is computed by counting the aggregate number of high threshold bits in the user data and the ECC value. In one implementation, the bits in the user data and the ECC value are combined to determine rCN, as indicated above. In one implementation, rCN is computed by the processor 410, the memory controller 420, or some other suitable processing unit, such as an external tester device. In one implementation, rCN is computed on-chip, e.g., by a memory controller that resides on the same chip as the memory array 402. In one implementation, the computed rCN value is stored in the recorded count storage 406. In another implementation, the computed rCN value is stored in a separate storage unit, e.g., a register or a latch, which can be configured for easy access by the memory controller 420.

FIG. 4B shows an example of an operation performed by the device 400 for reading data from memory. During the read operation, rCN is read from the recorded count storage 406 (or from another suitable storage unit, as the case may be). The user data is sensed from the memory array 402 using a first read level and the corresponding ECC value is read from the data ECC storage 404. An instant counter number (iCN) is computed based on the sensed user data and the ECC value read from the data ECC storage 404. In one implementation, iCN is computed by counting the aggregate number of low threshold bits in the user data and the ECC value. In another implementation, iCN is computed by counting the aggregate number of high threshold bits in the user data and the ECC value. In one implementation, iCN is computed by the processor 410, the memory controller 420, or some other suitable processing unit, such as an external tester device. In one implementation, iCN is computed on-chip, e.g., by a memory controller that resides on the same chip as the memory array 402. In one implementation, the computed value of iCN is stored in the instant count storage 407. The bit count difference ΔBC between iCN and rCN is computed and used to dynamically determine read levels for additional read operations, as described herein.

In case rCN is read incorrectly, the read level that is dynamically determined can be wrong (e.g., read level may be incorrectly moved up instead of being moved down, or vice versa), which can lead to a greater number of error bits in the sensed data that are not ECC-correctable. Accordingly, in one implementation, an ECC value is computed for rCN to improve the correctness of rCN that is obtained at the time of a read operation.

Figure 5A:
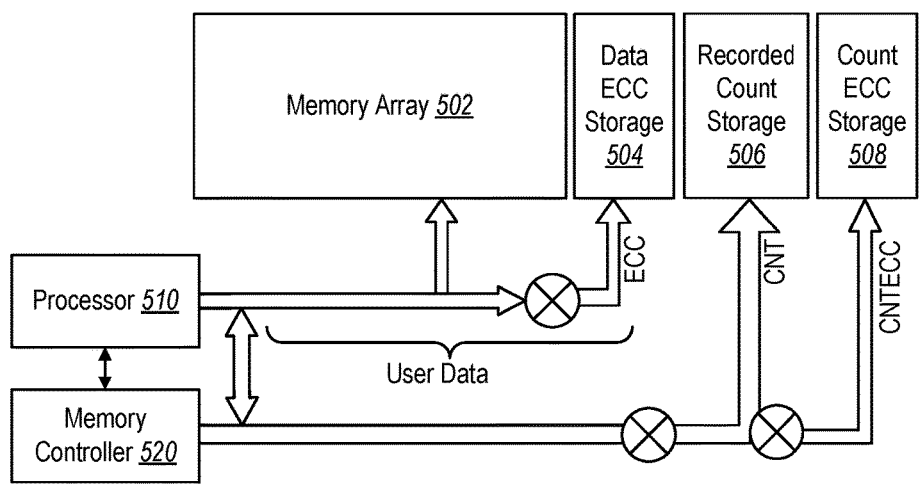
FIGS. 5A and 5B illustrate examples of a device for performing read operations on memory cells using dynamic read levels with error correction for recorded counter number, according to one implementation.
Figure 5B:
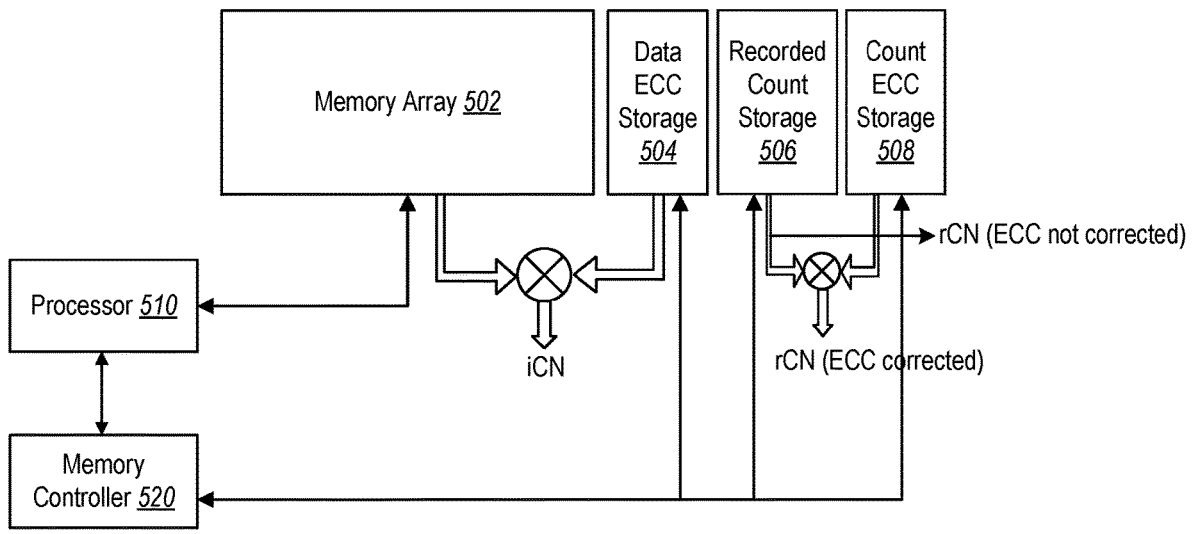

FIGS. 5A and 5B illustrate examples of a device 500 for performing read operations on memory cells using dynamic read levels with error correction for recorded counter number, according to one implementation. The device 500 includes a memory array 502, a data ECC storage 504, a recorded count storage 506, a count ECC storage 508, a processor 510 and a memory controller 520.

The memory array 502 is a suitable memory unit that is configured for storing user data. For example, the memory array 502 can be a chunk or page of memory, which includes a plurality of memory cells. The memory cells can be single-level cells or multi-level cells. In one implementation, the memory array 502 is a nonvolatile memory array, e.g., flash memory. However, in other implementations the memory array can be some other type of memory. In one implementation, the memory array 502 is similar to the memory array 402.

The data ECC storage 504 is a suitable storage unit that is configured for storing ECC data corresponding to the user data stored in the memory array 502. The data ECC storage 504 can be a separate portion of a memory device that includes the memory array 502. Alternatively, the data ECC storage 504 can be a separate memory unit, a register, or other hardware storage device, such as a hard disk. In one implementation, the data ECC storage 504 is similar to the data ECC storage 404.

The recorded count storage 506 is a suitable storage unit that is configured for storing recorded counter number (rCN) data. For example, the recorded count storage 506 can be a separate portion of a memory device that includes the memory array 502 and/or the data ECC storage 504. Alternatively, the recorded count storage 506 can be a separate memory unit, a register, or other hardware storage device, such as a hard disk. In one implementation, the recorded count storage 506 is similar to the recorded count storage 406.

The count ECC storage 508 is a suitable storage unit that is configured for storing count ECC corresponding to the rCN data stored in the recorded count storage 506. The count ECC storage 508 can be a separate portion of a memory device that includes the memory array 502, the data ECC storage 504, and/or the recorded count storage 506. Alternatively, the count ECC storage 508 can be a separate memory unit, a register, a latch, or other hardware storage device, such as a hard disk.

The processor 510 is a suitable computing unit that is configured to execute various instructions for the operation of the device 500, including instructions for exchanging user data between the memory array 502 and other modules of the device 500, or with external devices. The processor 510 can be a general purpose microprocessor, a microcontroller, or other suitable processing unit. In one implementation, the processor 510 controls the memory controller 520 for writing data to or reading data from the memory array 502. In one implementation, the processor 510 is similar to the processor 410.

The memory controller 520 includes hardware and software logic for performing various operations associated with memory coupled to the device 500, including the data array. In one implementation, the memory controller 520 programs the memory array 502, reads data from the memory array 502, or erases data stored in the memory array 502, among other uses. The memory controller 520 can be a microprocessor that executes instructions for programming, reading or erasing the memory array 502. In one implementation, the memory controller 520 performs operations for writing to or reading from the memory array 502 upon receiving commands from the processor 510. In one implementation, the memory controller 520 is similar to the memory controller 420.

In one implementation, the memory array 502 and the memory controller 520 are implemented on the same integrated circuit chip. The data ECC storage 504 and the recorded count storage 506 also can be implemented on the same chip, for example, when the data ECC storage 504 and the recorded count storage 506 are portions of the same memory device as the memory array 502. However, in other implementations, the memory controller 520 is implemented as a physically distinct device that is separate from the memory array 502. This may be the case, for example, when the memory controller 520 is an external computer, or an external tester device, among other suitable implementations.

The instructions executed by the processor 510 and/or the memory controller 520 are stored in suitable storage accessible to the processor 510 and/or the memory controller 520, e.g., in a flash memory module or hard disk, among others. For example, the instructions can be stored in other portions of the memory device that includes the memory array 502.

FIG. 5A shows an example of an operation performed by the device 500 for writing data to memory. User data is programmed to the memory array 502. An ECC value is computed on the user data and the ECC value is programmed to the data ECC storage 504. The ECC value can be computed at the time of writing the user data to the memory array 502, or the ECC value can be computed separately at a different time, e.g., after the user data is written to the memory array 502. The ECC value is computed by the processor 410, or the memory controller 420, as applicable, by applying a suitable ECC algorithm, such as Hamming Algorithm, Reed-Solomon Algorithm, or BCH algorithm, among others.

In addition to computing the ECC value on the user data, rCN is computed from the user data and the ECC value. rCN can be computed when the user data and the ECC value are programmed, or rCN can be computed at a different time after the user data and the ECC value are written to the memory array 502 and the data ECC storage 504 respectively. In one implementation, rCN is computed by counting the aggregate number of low threshold bits in the user data and the ECC value. In another implementation, rCN is computed by counting the aggregate number of high threshold bits in the user data and the ECC value. In one implementation, the bits in the user data and the ECC value are combined to determine rCN. In one implementation, rCN is computed by the processor 510, the memory controller 520, or some other suitable processing unit, such as an external tester device. In one implementation, rCN is computed on-chip, e.g., by a memory controller that resides on the same chip as the memory array 502. In one implementation, the computed rCN value is stored in the recorded count storage 506. In another implementation, the computed rCN value is stored in a separate storage unit, e.g., a register or a latch, which can be configured for easy access by the memory controller 520.

Following the computation of rCN, an ECC value is also computed on the rCN bits. This ECC value for rCN is programmed to the count ECC storage 508. A suitable ECC algorithm is used to compute the ECC value for rCN, such as Hamming Algorithm, Reed-Solomon Algorithm, or BCH algorithm, among others. In one implementation, the ECC value for rCN is computed by the processor 510, the memory controller 520, or some other suitable processing unit, such as an external tester device. In one implementation, the ECC value for rCN is computed on-chip, e.g., by a memory controller that resides on the same chip as the memory array 502.

FIG. 5B shows an example of an operation performed by the device 500 for reading data from memory. During the read operation, rCN is read from the recorded count storage 506 (or from another suitable storage unit, as the case may be) and the ECC value for rCN is read from the count ECC storage 508. An ECC operation is performed on rCN and the corresponding ECC value. For example, an XOR logic operation is performed by combing rCN with the corresponding ECC value. In one implementation, the ECC operation is performed by the processor 510, the memory controller 520, or some other suitable processing unit, such as an external tester device. In one implementation, the ECC operation is performed on-chip, e.g., by a memory controller that resides on the same chip as the memory array 502.

The result of the ECC operation indicates whether rCN is correctable by the corresponding ECC value, e.g. whether the number of error bits in rCN as read from the recorded count storage 506 is within the maximum number of bits of the corresponding ECC value read from the count ECC storage 508. If the result of the ECC operation indicates that rCN is correctable, then dynamic read level determination for additional read operations is performed, as described below. However, if the result of the ECC operation indicates that rCN is not correctable (e.g., when the number of error bits in rCN as read from the recorded count storage 506 exceeds the maximum number of bits of the corresponding ECC value read from the count ECC storage 508), then dynamic read level determination is not performed. The user data is read from the memory array 502 and the corresponding ECC value is read from the data ECC storage 504.

An instant counter number (iCN) is computed based on the user data read from the memory array 502 and the ECC value for the user data read from the data ECC storage 504. In one implementation, iCN is computed by counting the aggregate number of low threshold bits in the user data and the ECC value. In another implementation, iCN is computed by counting the aggregate number of high threshold bits in the user data and the ECC value. In one implementation, the computed value of iCN is stored in a suitable storage unit, e.g., in a memory array, a register or a latch. In one implementation, iCN is computed by the processor 510, the memory controller 520, or some other suitable processing unit, such as an external tester device. In one implementation, iCN is computed on-chip, e.g., by a memory controller that resides on the same chip as the memory array 502. The bit count difference ΔBC between iCN and rCN is then computed and used to dynamically determined read levels for additional read operations, as described herein.

Figure 6:
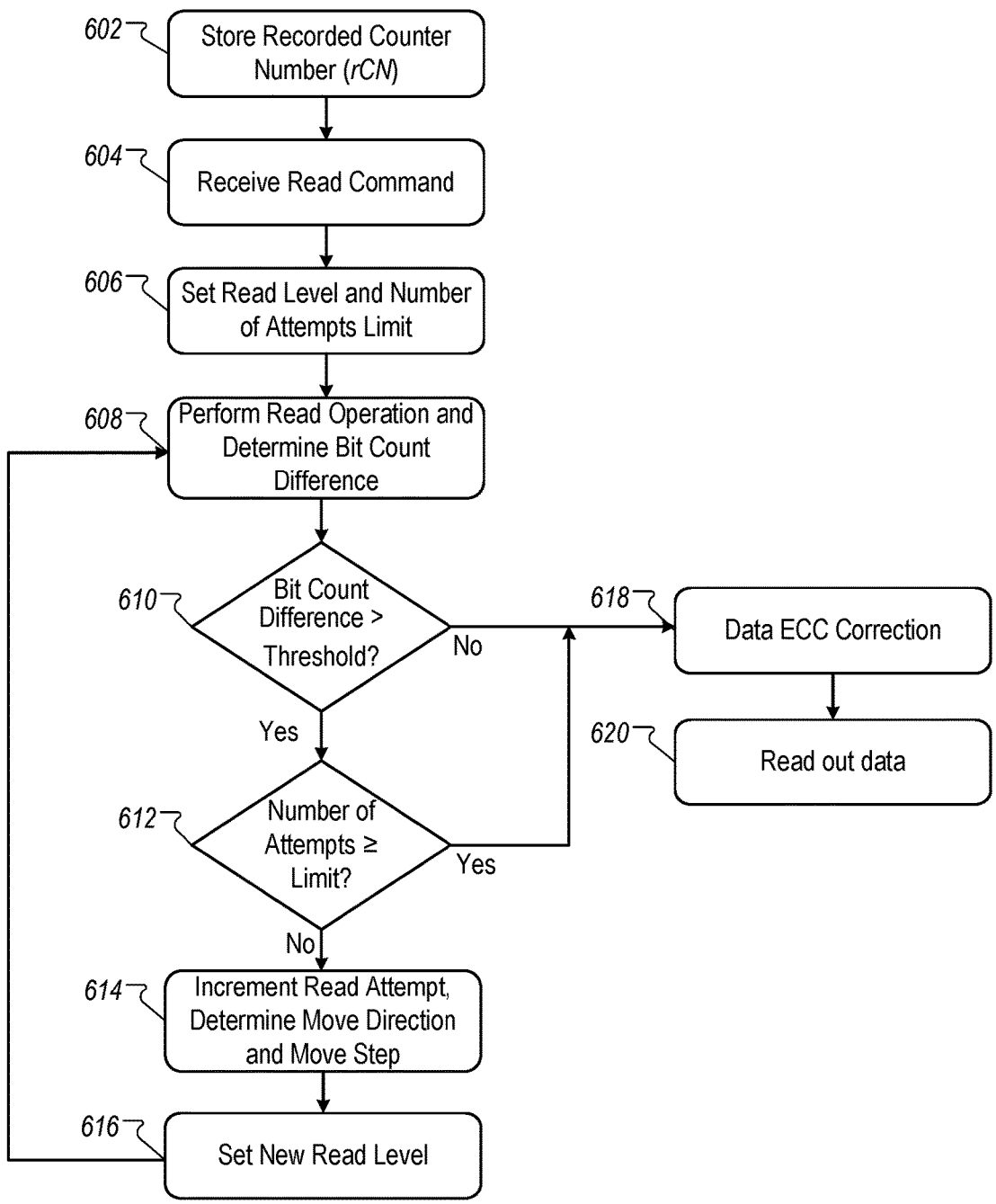
FIG. 6 illustrates an example of a process for performing read operations on memory cells using dynamic read levels, according to one implementation.

FIG. 6 illustrates an example of a process 600 for performing read operations on memory cells using dynamic read levels, according to one implementation. In one implementation, the process 600 is performed by the device 400 to read user data from the memory array 402. Accordingly, the following sections describe the process 600 with respect to the device 400. However, in other implementations, the process 600 may be performed by other devices or systems.

In one implementation, the process 600 is performed by the processor 410, or the memory controller 420, or some other suitable processing unit, such as an external tester device. At 602, a recorded counter number (rCN) is stored. For example, when writing user data to memory array 402, the aggregate number of low threshold bits (or high threshold bits, depending on the implementation) is computed based on the user data and the corresponding ECC value. The computed rCN value is stored in the recorded count storage 406, or some other suitable storage unit, such as a register or a latch.

At 604, a read command is received. For example, a read command is received to read the user data that is stored in the memory array 402.

At 606, the read level and number of attempts limit is set. For example, the threshold voltage for the initial read level (e.g., 212) is set. Since additional read operations using dynamic read levels are contemplated, an upper limit on the number of read operations that can be performed for a read command is also determined. In one implementation, the upper limit is set such that a large number of additional read operations are not performed for a read command (e.g., when the dynamic read levels cannot be determined accurately), which may negatively impact memory read performance.

At 608, a read operation is performed and the bit count is determined. For example, a first read operation is performed by executing a sensing operation at the initial read level set at 606. The user data is read from the memory array 402, the corresponding ECC value is read from the data ECC storage 404 and rCN is read from the recorded count storage 406. An instant counter number (iCN) is computed based on the user data read from the memory array 402 and the ECC value read from the data ECC storage 404. The computed iCN value is stored in the instant count storage 407. The difference between iCN and rCN is determined as the bit count difference ΔBC=iCN−rCN.

At 610, a determination is made whether the bit count difference is greater than a threshold. For example, the absolute value of the bit count difference, |ΔBC|, is compared to the dynamic read level threshold M to determine whether |ΔBC|>M.

If the bit count difference is determined to be greater than the dynamic read level threshold, then additional read operations may be performed using updated read levels that are adjusted dynamically. In such a case, at 612, a determination is made whether a number of read attempts already made is equal to or greater than a limit. For example, before performing an additional read operation, a check is made whether the number of read operations that have already been performed in response to the read command has exceeded the upper limit on the number of read operations that can be performed for a read command.

If the number of read attempts already made is determined to be less than the upper limit on the number of read operations that can be performed, then at 614, the read attempt is incremented and the move direction and move step are determined. For example, the polarity of ΔBC is checked. In one implementation, if ΔBC is positive (e.g., iCN is greater than rCN), then the new read level is moved down. On the other hand, if ΔBC is negative (e.g., iCN is less than rCN), then the new read level is moved up.

The absolute value |ΔBC| is also compared to the move step threshold N. If |ΔBC|≥N, then a large move step is applied, e.g., the new read level is selected to differ from the last read level by a large voltage amount (e.g., 100 mV). However, if |ΔBC|<N, then a small move step is applied, e.g., the new read level is selected to differ from the last read level by a small voltage amount (e.g., 50 mV).

At 616, a new read level is set. For example, a new read level is set based on the move direction and move step determined at 614, in comparison to the read level used in the last read operation. One or more additional read operations are then performed following 608-616, until |ΔBC|≤M or the number of read attempts already made is equal to or greater than the upper limit on the number of read operations that can be performed.

If at 610 it is determined that the bit count difference is less than or equal to the dynamic read level threshold (|ΔBC|≤M), or at 612 it is determined that the number of read attempts already made is equal to or greater than the upper limit on the number of read operations that can be performed, then additional read operations are skipped, and at 618, data ECC correction is performed. For example, an ECC operation is performed on the user data read from the memory array 402 in the most recent read operation, using the ECC value read from the data ECC storage 404.

At 620, the data is read out. For example, the ECC-corrected user data is provided to another module of the device 400, or to an external entity, for performing other operations related to the user data.

In the above manner, the process 600 can be used to reduce the number of bit errors in the user data obtained in response to a read command by performing iterative read operations using dynamic read levels. In each read operation, the read level is adjusted based on the move direction and move step, such that the read level moves towards a read level that is below the dynamic read level threshold M, at which time the number of error bits in the user data can be corrected by ECC. However, to limit the performance impact of the additional read operations, the number of additional read operations may be capped at an upper limit. If the upper limit is reached, then the user data is read out, even if the number of error bits in the user data exceeds the dynamic read level threshold M.

In one implementation, rCN is determined and stored once at 602, e.g., at the time of or after storing the user data in the memory array 402. Subsequently, 604-620 are performed multiple times, e.g., when read commands are issued to read the user data from the memory array 402. rCN may be recomputed and a new value of rCN stored when the user data is updated, e.g., when or after new user data is written to the memory array 402.

Figure 7:
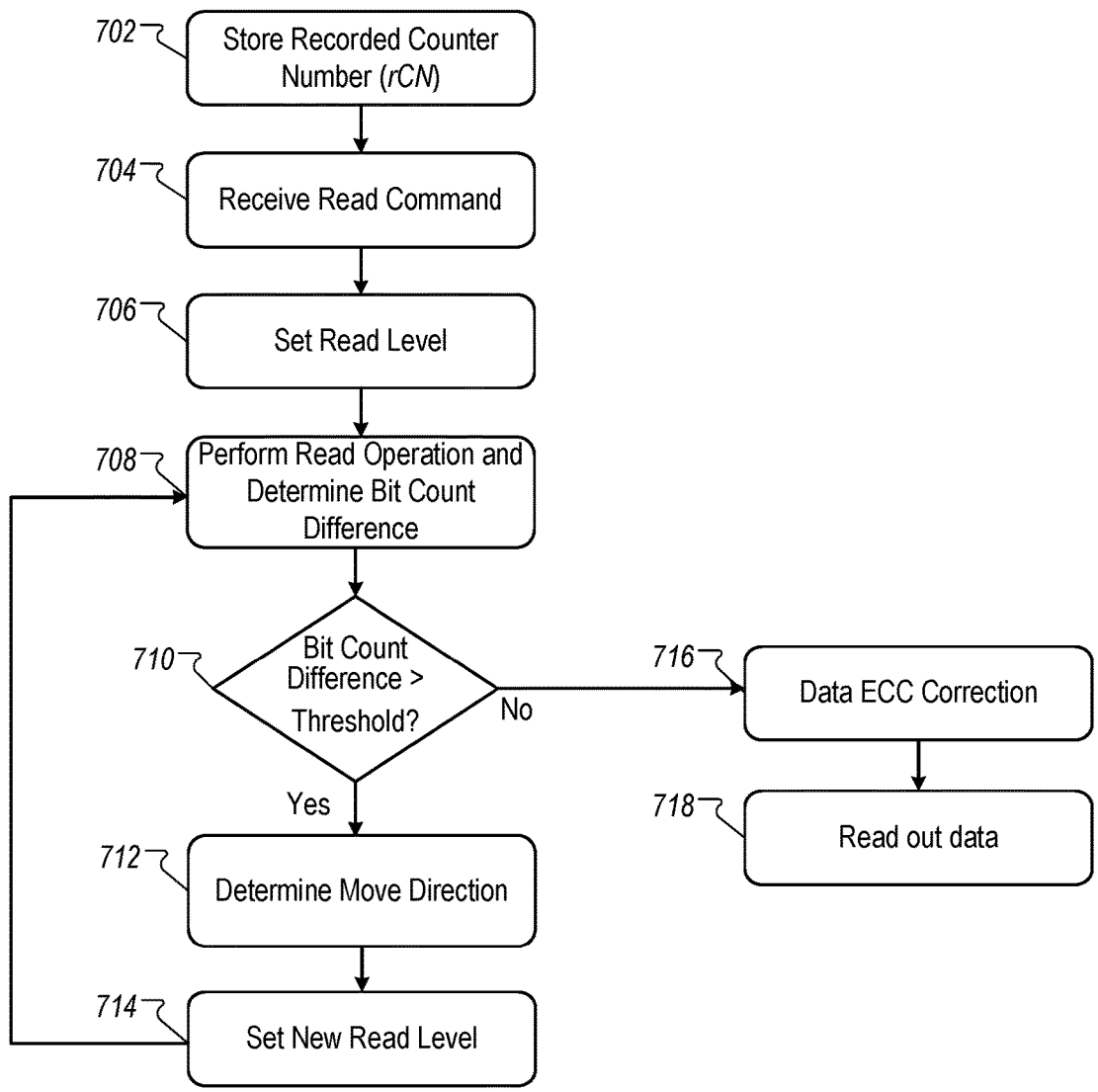
FIG. 7 illustrates an example of a process for performing read operations on memory cells using dynamic read levels, according to another implementation.

FIG. 7 illustrates an example of a process 700 for performing read operations on memory cells using dynamic read levels, according to another implementation. In one implementation, the process 700 is performed by the device 400 to read user data from the memory array 402. Accordingly, the following sections describe the process 700 with respect to the device 400. However, in other implementations, the process 700 may be performed by other devices or systems.

In one implementation, the process 700 is performed by the processor 410, or the memory controller 420, or some other suitable processing unit, such as an external tester device. At 702, a recorded counter number (rCN) is stored. For example, when writing user data to memory array 402, the aggregate number of low threshold bits (or high threshold bits, depending on the implementation) is computed based on the user data and the corresponding ECC value. The computed rCN value is stored in the recorded count storage 406, or some other suitable storage unit, such as a register or a latch.

At 704, a read command is received. For example, a read command is received to read the user data that is stored in the memory array 402.

At 706, the read level is set. For example, the threshold voltage for the initial read level (e.g., 212) is set.

At 708, a read operation is performed and the bit count is determined. For example, a first read operation is performed by executing a sensing operation at the initial read level set at 706. The user data is read from the memory array 402, the corresponding ECC value is read from the data ECC storage 404 and rCN is read from the recorded count storage 406. An instant counter number (iCN) is computed based on the user data read from the memory array 402 and the ECC value read from the data ECC storage 404. The computed iCN value is stored in the instant count storage 407. The difference between iCN and rCN is determined as the bit count difference $\Delta BC=iCN-rCN$.

At 710, a determination is made whether the bit count difference is greater than a threshold. For example, the absolute value of the bit count difference, $|\Delta BC|$, is compared to the dynamic read level threshold M to determine whether $|\Delta BC|>M$.

If the bit count difference is determined to be greater than the dynamic read level threshold, then additional read operations may be performed using updated read levels that are adjusted dynamically. In such a case, at 712, the move direction is determined. For example, the polarity of $\Delta BC$ is checked. In one implementation, if $\Delta BC$ is positive (e.g., iCN is greater than rCN), then the new read level is moved down. On the other hand, if $\Delta BC$ is negative (e.g., iCN is less than rCN), then the new read level is moved up.

At 714, a new read level is set. For example, a new read level is set based on the move direction determined at 712, in comparison to the read level used in the last read operation. One or more additional read operations are then performed following 708-714, until $|\Delta BC|\leq M$.

If at 710 it is determined that the bit count difference is less than or equal to the dynamic read level threshold ($|\Delta BC|\leq M$), then additional read operations are skipped, and at 716, data ECC correction is performed. For example, an ECC operation is performed on the user data read from the memory array 402 in the most recent read operation, using the ECC value read from the data ECC storage 404.

At 718, the data is read out. For example, the ECC-corrected user data is provided to another module of the device 400, or to an external entity, for performing other operations related to the user data.

In the above manner, the process 700 can be used to reduce the number of bit errors in the user data obtained in response to a read command by performing iterative read operations using dynamic read levels. In each read operation, the read level is adjusted based on the move direction, such that the read level moves towards a read level that is below the dynamic read level threshold M, at which time the number of error bits in the user data can be corrected by ECC.

In one implementation, rCN is determined and stored once at 702. Subsequently, 704-718 are performed multiple times, e.g., when read commands are issued to read the user data from the memory array 402. rCN may be recomputed and a new value of rCN stored when the user data is updated, e.g., when or after new user data is written to the memory array 402.

Figure 8:
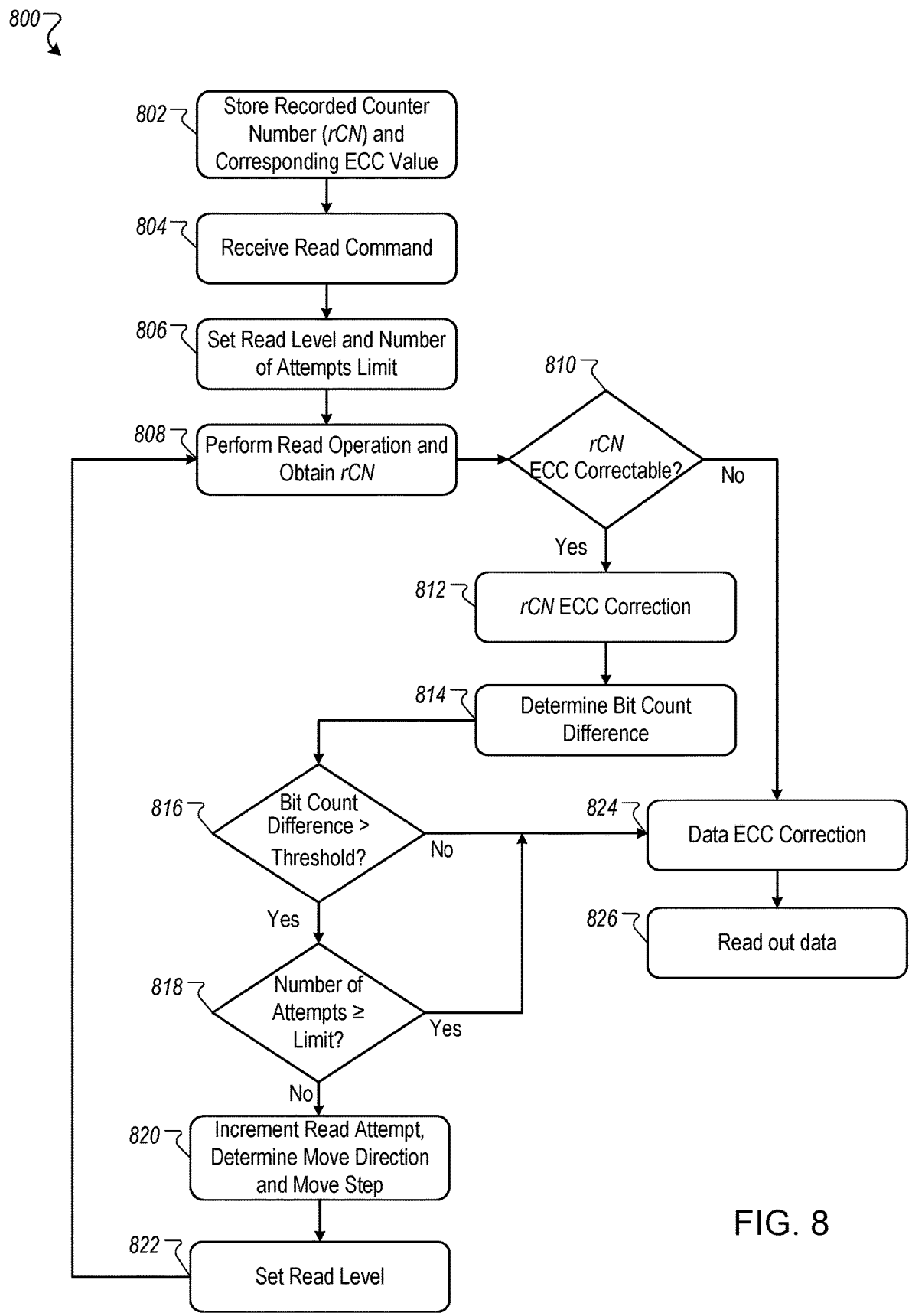
FIG. 8 illustrates an example of a process for performing read operations on memory cells using dynamic read levels with error correction for recorded counter number, according to one implementation.

FIG. 8 illustrates an example of a process 800 for performing read operations on memory cells using dynamic read levels with error correction for recorded counter number, according to one implementation. The process 800 is performed by the device 500 to read user data from the memory array 502. Accordingly, the following sections describe the process 800 with respect to the device 500. However, in other implementations, the process 800 may be performed by other devices or systems.

The process 800 is performed by the processor 510, or the memory controller 520, or some other suitable processing unit, such as an external tester device. At 802, a recorded counter number (rCN) and corresponding ECC value is stored. For example, when writing user data to memory array 802, the aggregate number of low threshold bits (or high threshold bits, depending on the implementation) is computed based on the user data and the ECC value corresponding to the user data. An ECC value for the rCN data is computed using a suitable ECC algorithm. The computed rCN data is stored in the recorded count storage 506, or some other suitable storage unit, such as a register or a latch, and the corresponding ECC value is stored in the count ECC storage 508.

At 804, a read command is received. For example, a read command is received to read the user data that is stored in the memory array 502.

At 806, the read level and number of attempts limit is set. For example, the threshold voltage for the initial read level (e.g., 212) is set. Since additional read operations using dynamic read levels are contemplated, an upper limit on the number of read operations that can be performed for a read command is also determined. In one implementation, the upper limit is set such that a large number of additional read operations are not performed for each read command (e.g., when the dynamic read levels cannot be determined accurately), which may negatively affect memory read performance. The number of attempts limit may be optional. For example, in one implementation, the number of attempts limit is not used. In such an implementation, only the read level is set at 806.

At 808, a read operation is performed and rCN is obtained. For example, a first read operation is performed by executing a sensing operation at the initial read level set at 806. The user data is read from the memory array 502 and the corresponding ECC value is read from the data ECC storage 504. In addition, the rCN value is read from the recorded count storage 506 or other storage location, and the count ECC is read from count ECC storage 508.

At 810, it is determined whether rCN is correctable. For example, the ECC value corresponding to the rCN data is read from the count ECC storage 508 and an ECC check is performed based on the rCN data and the ECC value to determine whether rCN can be corrected by the ECC value.

If a determination is made that rCN is ECC correctable, then at 812 an ECC correction is performed for rCN. For example, an ECC operation is performed based on the rCN data read from recorded count storage 506 and the corresponding ECC value read from the count ECC storage 508. The result of the rCN ECC correction is used subsequently.

At 814, a bit count difference is determined. For example, an instant counter number (iCN) is computed based on the user data read from the memory array 402 and the ECC value read from the data ECC storage 404. The computed iCN value is stored in a suitable storage unit, e.g., a memory location, register or a latch. The difference between iCN and rCN (with the ECC correction) is determined as the bit count difference $\Delta BC=iCN-rCN$.

At 816, a determination is made whether the bit count difference is greater than a threshold. For example, the absolute value of the bit count difference, $|\Delta BC|$, is compared to the dynamic read level threshold M to determine whether $|\Delta BC|>M$.

If the bit count difference is determined to be greater than the dynamic read level threshold, then additional read operations may be performed using updated read levels that are adjusted dynamically. In such a case, in one implementation, at 818, a determination is made whether the number of read attempts already made is equal to or greater than a limit. For example, before performing an additional read operation, a check is made whether the number of read operations that have already been performed in response to the read command has exceeded the upper limit on the number of read operations that can be performed for a read command. The determination regarding the number of read attempts is optional. For example, in one implementation, the number of attempts limit is not used. In such an implementation, the operations at 818 are not performed.

If the number of read attempts already made is determined to be less than the upper limit on the number of read operations that can be performed, then at 820, the read attempt is incremented and the move direction and move step are determined. For example, the polarity of $\Delta BC$ is checked. In one implementation, if $\Delta BC$ is positive (e.g., iCN is greater than rCN), then the new read level is moved down. On the other hand, if $\Delta BC$ is negative (e.g., iCN is less than rCN), then the new read level is moved up.

The absolute value $|\Delta BC|$ is also compared to the move step threshold N If $|\Delta BC| \geq N$, then a large move step is applied, e.g., the new read level is selected to differ from the last read level by a large voltage amount (e.g., 100 mV). However, if $|\Delta BC|<N$, then a small move step is applied, e.g., the new read level is selected to differ from the last read level by a small voltage amount (e.g., 50 mV). The comparison of $|\Delta BC|$ to the move step threshold N is optional. For example, in one implementation, the number of attempts limit is not used. In such an implementation, the comparison of $|\Delta BC|$ to N not performed, and accordingly, the new read level is not based on this comparison.

At 822, a new read level is set. For example, a new read level is set based on the move direction determined at 820, in comparison to the read level used in the last read operation. One or more additional read operations are then performed following 808-822, until $|\Delta BC| \leq M$ or the number of read attempts already made is equal to or greater than the upper limit on the number of read operations that can be performed. In one implementation, when such additional read operations are performed, further checks for rCN ECC correction at 810 and 812 are skipped. This may be the case, for example, when the value of rCN has not been updated in between the read operations, such that the ECC-corrected rCN obtained following the initial read operation can be used for the additional read operations.

If at 810 a determination is made that rCN is not ECC correctable, or at 816 a determination is made that the bit count difference is less than or equal to the dynamic read level threshold ($|\Delta BC| \leq M$), or at 818 it is determined that the number of read attempts already made is equal to or greater than the upper limit on the number of read operations that can be performed for the read command, then additional read operations are skipped, and at 824, data ECC correction is performed. For example, an ECC operation is performed on the user data read from the memory array 502 in the most recent read operation, using the ECC value read from the data ECC storage 504.

At 826, the data is read out. For example, the ECC-corrected user data is provided to some other process or module of the device 500, or to an external device, for performing other operations related to the user data.

In the above manner, the process 800 can be used to reduce the number of bit errors in the user data obtained in response to a read command by performing iterative read operations using dynamic read levels. In each read operation, the read level is adjusted based on the move direction, and optionally, the move step, such that the read level moves towards a read level that is within the dynamic read level threshold M, at which time the number of error bits in the user data can be corrected by the ECC operation. To ensure accuracy of the dynamic read levels for the additional read operations, rCN is computed to be ECC correctable. Further, to limit the performance impact of the additional read operations, the number of additional read operations may be capped at an upper limit. In such cases, if the upper limit is reached, then the user data is read out, even if the number of error bits in the user data exceeds the dynamic read level threshold M.

In one implementation, rCN and the corresponding ECC value are determined and stored once at 602, e.g., at the time of or after storing the user data in the memory array 502. Subsequently, 804-826 are performed multiple times, e.g., when read commands are issued to read the user data from the memory array 502. rCN and the corresponding ECC value may be recomputed, and new values for rCN and the corresponding ECC stored, when the user data is updated, e.g., when or after new user data is written to the memory array 502.

The disclosed and other examples can be implemented as one or more computer program products, for example, one or more modules of computer program instructions encoded on a computer readable medium for execution by, or to control the operation of, data processing apparatus. The implementations can include single or distributed processing of algorithms. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A method comprising:
    performing a first read of data from a memory array using a first voltage level;
    determining an instant bit count corresponding to a number of bits of the data obtained by the first read;
    accessing a recorded bit count corresponding to a number of bits in the data, the recorded bit count determined at a time of writing the data to the memory array;
    computing a difference between the instant bit count and the recorded bit count;
    conditioned on determining that the difference is less than or equal to a first threshold value, outputting the data read from the memory array using the first read;
    conditioned on determining that the difference is greater than the first threshold value, obtaining a number of read operations that have been performed to read the data from the memory array; and
    upon determining that the number of read operations is less than a threshold number of read operations, performing a second read of the data from the memory array using a second voltage level.

2. The method of claim 1, wherein performing the second read comprises:
    conditioned on determining that the instant bit count is less than the recorded bit count by a margin greater than the first threshold value, selecting, as the second voltage level, a voltage level that is greater than the first voltage level; and
    conditioned on determining that the instant bit count is greater than the recorded bit count by a margin greater than the first threshold value, selecting, as the second voltage level, a voltage level that is less than the first voltage level.

3. The method of claim 1, wherein performing the second read comprises:
    conditioned on determining that the instant bit count is less than the recorded bit count by a margin greater than the first threshold value, selecting, as the second voltage level, a voltage level that is less than the first voltage level; and
    conditioned on determining that the instant bit count is greater than the recorded bit count by a margin greater than the first threshold value, selecting, as the second voltage level, a voltage level that is greater than the first voltage level.

4. The method of claim 1, wherein performing the second read comprises:
    upon determining that the difference is greater than the first threshold value, comparing the difference to a second threshold value;
    conditioned on a result of the comparison indicating that the difference is less than the second threshold value, selecting, as the second voltage level, a voltage level that deviates from the first voltage level by a first amount; and
    conditioned on a result of the comparison indicating that the difference is greater than the second threshold value, selecting, as the second voltage level, a voltage level that deviates from the first voltage level by a second amount that is greater than the first amount.

5. The method of claim 1, wherein determining the instant bit count comprises:
reading the number of bits of data from the memory array;
accessing an error correcting code (ECC) value corresponding to the data, wherein the ECC value is based on the data at the time of writing the data to the memory array; and
determining the instant bit count by combining the number of bits read from the memory array and the ECC value.

6. A memory device comprising:
one or more processors; and
one or more computer-readable storage media storing instructions that, when executed by the one or more processors, are configured to cause the one or more processors to perform operations comprising:
performing a first read of data from a memory array using a first voltage level;
determining an instant bit count corresponding to a number of bits of the data obtained by the first read;
accessing a recorded bit count corresponding to a number of bits in the data, the recorded bit count determined at a time of writing the data to the memory array;
computing a difference between the instant bit count and the recorded bit count;
conditioned on determining that the difference is less than or equal to a first threshold value, outputting the data read from the memory array using the first read;
conditioned on determining that the difference is greater than the first threshold value, obtaining a number of read operations that have been performed to read the data from the memory array; and
upon determining that the number of read operations is less than a threshold number of read operations, performing a second read of the data from the memory array using a second voltage level.

7. The memory device of claim 6, wherein performing the second read comprises:
conditioned on determining that the instant bit count is less than the recorded bit count by a margin greater than the first threshold value, selecting, as the second voltage level, a voltage level that is greater than the first voltage level; and
conditioned on determining that the instant bit count is greater than the recorded bit count by a margin greater than the first threshold value, selecting, as the second voltage level, a voltage level that is less than the first voltage level.

8. The memory device of claim 7, wherein performing the second read comprises:
conditioned on determining that the instant bit count is less than the recorded bit count by a margin greater than the first threshold value, selecting, as the second voltage level, a voltage level that is less than the first voltage level; and
conditioned on determining that the instant bit count is greater than the recorded bit count by a margin greater than the first threshold value, selecting, as the second voltage level, a voltage level that is greater than the first voltage level.

9. The memory device of claim 7, wherein performing the second read comprises:
upon determining that the difference is greater than the first threshold value, comparing the difference to a second threshold value;
conditioned on a result of the comparison indicating that the difference is less than the second threshold value, selecting, as the second voltage level, a voltage level that deviates from the first voltage level by a first amount; and
conditioned on a result of the comparison indicating that the difference is greater than the second threshold value, selecting, as the second voltage level, a voltage level that deviates from the first voltage level by a second amount that is greater than the first amount.

10. The memory device of claim 7, wherein determining the instant bit count comprises:
reading the number of bits of data from the memory array;
accessing an error correcting code (ECC) value corresponding to the data, wherein the ECC value is based on the data at the time of writing the data to the memory array; and
determining the instant bit count by combining the number of bits read from the memory array and the ECC value.

11. A method comprising:
performing a first read of data from a memory array using a first voltage level;
determining an instant bit count corresponding to a number of bits of the data obtained by the first read;
accessing a recorded bit count corresponding to a number of bits in the data, the recorded bit count determined at a time of writing the data to the memory array;
computing a difference between the instant bit count and the recorded bit count;
conditioned on determining that the difference is less than or equal to a first threshold value, outputting the data read from the memory array using the first read;
conditioned on determining that the difference is greater than the first threshold value, performing a second read of the data from the memory array using a second voltage level that is distinct from the first voltage level, wherein performing the second read comprises:
conditioned on determining that the instant bit count is less than the recorded bit count by a margin greater than the first threshold value, selecting, as the second voltage level, a voltage level that is less than the first voltage level; and
conditioned on determining that the instant bit count is greater than the recorded bit count by a margin greater than the first threshold value, selecting, as the second voltage level, a voltage level that is greater than the first voltage level.

12. The method of claim 11, wherein performing the second read comprises:
based on determining that the difference is greater than the first threshold value, comparing the difference to a second threshold value;
conditioned on a result of the comparison indicating that the difference is less than the second threshold value, selecting, as the second voltage level, a voltage level that deviates from the first voltage level by a first amount; and
conditioned on a result of the comparison indicating that the difference is greater than the second threshold value, selecting, as the second voltage level, a voltage level that deviates from the first voltage level by a second amount that is greater than the first amount.

13. The method of claim 11, wherein performing the second read using the second voltage level based on determining that the difference is greater than the first threshold value comprises:

based on determining that the difference is greater than the first threshold value, obtaining a number of read operations that have been performed to read the data from the memory array; and performing the second read based on determining that the number of read operations is less than a preselected threshold number of read operations.

14. The method of claim 11, wherein determining the instant bit count comprises:

reading the number of bits of data from the memory array;

accessing an error correcting code (ECC) value corresponding to the data, wherein the ECC value is based on the data at the time of writing the data to the memory array; and determining the instant bit count by combining the number of bits read from the memory array and the ECC value.

15. The method of claim 11, wherein accessing the recorded bit count comprises performing an ECC check on the recorded bit count, the method further comprising:

computing an ECC value of the recorded bit count at the time of writing the data to the memory array;

at a time of accessing the recorded bit count, accessing the ECC value;

performing the ECC check by combining the recorded bit count and the ECC value;

determining whether the recorded bit count can be corrected based on the ECC check; and obtaining the difference between the instant bit count and the recorded bit count in response to determining that the recorded bit count can be corrected based on the ECC check.

16. A memory device comprising:

one or more processors;

one or more computer-readable storage media storing instructions that, when executed by the one or more processors, are configured to cause the one or more processors to perform operations comprising:

performing a first read of data from a memory array using a first voltage level;

determining an instant bit count corresponding to a number of bits of the data obtained by the first read;

accessing a recorded bit count corresponding to a number of bits in the data, the recorded bit count determined at a time of writing the data to the memory array;

computing a difference between the instant bit count and the recorded bit count;

conditioned on determining that the difference is less than or equal to a first threshold value, outputting the data read from the memory array using the first read;

conditioned on determining that the difference is greater than the first threshold value, performing a second read of the data from the memory array using a second voltage level that is distinct from the first voltage level, wherein performing the second read comprises:

conditioned on determining that the instant bit count is less than the recorded bit count by a margin greater than the first threshold value, selecting, as the second voltage level, a voltage level that is less than the first voltage level; and conditioned on determining that the instant bit count is greater than the recorded bit count by a margin greater than the first threshold value, selecting, as the second voltage level, a voltage level that is greater than the first voltage level.

17. The memory device of claim 16, wherein performing the second read comprises:

based on determining that the difference is greater than the first threshold value, comparing the difference to a second threshold value;

conditioned on a result of the comparison indicating that the difference is less than the second threshold value, selecting, as the second voltage level, a voltage level that deviates from the first voltage level by a first amount; and conditioned on a result of the comparison indicating that the difference is greater than the second threshold value, selecting, as the second voltage level, a voltage level that deviates from the first voltage level by a second amount that is greater than the first amount.

18. The memory device of claim 16, wherein performing the second read using the second voltage level based on determining that the difference is greater than the first threshold value comprises:

based on determining that the difference is greater than the first threshold value, obtaining a number of read operations that have been performed to read the data from the memory array; and performing the second read based on determining that the number of read operations is less than a preselected threshold number of read operations.

19. The memory device of claim 16, wherein determining the instant bit count comprises:

reading the number of bits of data from the memory array;

accessing an error correcting code (ECC) value corresponding to the data, wherein the ECC value is based on the data at the time of writing the data to the memory array; and determining the instant bit count by combining the number of bits read from the memory array and the ECC value.

20. The memory device of claim 16, wherein accessing the recorded bit count comprises performing an ECC check on the recorded bit count, the operations further comprising:

computing an ECC value of the recorded bit count at the time of writing the data to the memory array;

at a time of accessing the recorded bit count, accessing the ECC value;

performing the ECC check by combining the recorded bit count and the ECC value;

determining whether the recorded bit count can be corrected based on the ECC check; and obtaining the difference between the instant bit count and the recorded bit count in response to determining that the recorded bit count can be corrected based on the ECC check.

* * * * *